United States Patent [19]

Komatsu

[11] Patent Number: 4,748,489
[45] Date of Patent: May 31, 1988

[54] INTEGRATED CIRCUIT SEMICONDUCTOR DEVICE HAVING IMPROVED ISOLATION REGION

[75] Inventor: Michio Komatsu, Tokyo, Japan

[73] Assignee: NEC Corporation, Tokyo, Japan

[21] Appl. No.: 842,797

[22] Filed: Mar. 24, 1986

[30] Foreign Application Priority Data

Mar. 22, 1985 [JP] Japan .................................. 60-57801

[51] Int. Cl.⁴ .......................................... H01L 27/04
[52] U.S. Cl. .................................. 357/50; 357/23.8; 357/23.11; 357/49; 357/41
[58] Field of Search ............... 357/23.11, 49, 50, 23.8, 357/41

[56] References Cited

U.S. PATENT DOCUMENTS

| 3,751,722 | 8/1973 | Richman | 357/23.11 |
| 4,523,369 | 7/1985 | Nagakubo | 357/49 |
| 4,546,536 | 10/1985 | Anantha et al. | 357/50 |

Primary Examiner—Edward J. Wojciechowicz
Attorney, Agent, or Firm—Burns, Doane, Swecker & Mathis

[57] ABSTRACT

An integrated circuit semiconductor device having first and second circuit elements isolated by an improved isolation region is disclosed. The isolation region includes first and second thick insulating layers at least partly embedded in a semiconductor substrate of one conductivity and an impurity portion of one conductivity having a higher impurity concentration than that of the substrate, provided between the first and second thick insulating layers such that it is separated from both of the first and second circuit elements.

13 Claims, 4 Drawing Sheets

INTEGRATED CIRCUIT SEMICONDUCTOR DEVICE HAVING IMPROVED ISOLATION REGION

BACKGROUND OF THE INVENTION

The present invention relates to an integrated circuit semiconductor device having an improved isolation region for isolating circuit elements formed in a semiconductor substrate, and more particularly to an improved isolation of insulated-gate type field effect transistors (hereinafter abbreviated as IGFET's) of the N-channel type formed in a P-type area of a semiconductor substrate.

In an integrated circuit semiconductor device, circuit elements are isolated each other by a thick field silicon oxide layer partly embedded in a semiconductor substrate of one conductivity type with a channel stopper region of one conductivity having a higher impurity concentration than that of the substrate being provided under the bottom of the embedded field silicon layer. The isolation region consisting of the field silicon oxide layer and the channel stopper region must realize a high threshold voltage in the field area. For that reason, it is desirable to make the field oxide type as thick as possible and impurity concentration of the channel stopper region as high as possible. However, the thickness of the field oxide layer is restricted to some extent because a too thick field oxide layer sacrifices the required flatness of the surface of the device and produces crystal defects in the active region, that is, circuit element forming region. On the other hand, the impurity concentration of the channel stopper region is also restricted, because an impurity for forming the channel stopper region must be introduced into the substrate prior to a thermal oxidation process for forming the thick field oxide layer. The thermal oxidation process is conducted under a high temperature for a long time and therefore, the impurity concentration of the channel stopper region cannot be increased to a level higher than a certain limit. Morever, even if the impurity concentration of the channel stopper region could be increased, the junction breakdown voltage decreases between the channel stopper region and one region of the circuit element such as a source or drain region of the IGFET which is in contact with the channel stopper region. Thus, the upper limit of the impurity concentration of the channel stopper region under the partially embedded field oxide layer was $10^{18}$ atoms/cm$^3$.

Further, when the device of the above-mentioned structure is irradiated with ionizing radiations ($\gamma$-rays, $\alpha$-rays or electron rays), positive holes in the electron-positive hole pairs formed in the silicon oxide layer migrate into the interface between the silicon substrate and the silicon oxide layer, and are trapped near the interface. Therefore, a fixed electrical charge of positive polarity accumulates in the silicon oxide layer. In the case of a P-type silicon substrate, the electrical field is established in a direction inverse to the surface of the silicon substrate and therefore, the leakage current is apt to flow by the irradiation of the ionizing radiations. The leakage current increases with the increase of the irradiation. Further, the ionized positive holes are produced more in a thick silicon oxide layer than in a thin silicon oxide layer and therefore, the leakage current due to the ionizing radiations are increased under the thick silicon oxide layer at the isolation region. Therefore, if the effect by the irradiation of the ionizing radiations is to be considered, the field insulating layer on the P-type substrate area to isolate N-type regions must be thin.

SUMMARY OF THE INVENTION

An object of the present invention is to provide an integrated circuit semiconductor device having an effective isolation region for isolating circuit elements, which realizes a high threshold voltage in the field area without decreasing the breakdown voltage.

Another object of the present invention is to provide an isolation structure which has a low leak current due to the ionizing radiations.

According to the present invention, there is provided an integrated circuit semiconductor device comprising a semiconductor substrate having an area of one conductivity type, first and second circuit element formed in the area of the substrate, and an isolation region provided between the first and second circuit elements for isolating the circuit elements from each other, the isolation region including a first impurity portion of one conductivity type having a higher impurity concentration than that of the area of the substrate, a thin insulating film provided on the upper surface of the first impurity portion, a first and a second thick insulating layer provided on the opposite sides of the thin insulating film and at least partly embedded in the substrate, and a second and a third impurity portion of one conductivity type having an impurity concentration higher than that of the area of the substrate and lower than that of the first impurity portion provided under the first and second thick insulating layers, respectively. The second and third impurity portions may be omitted. Favorably, the impurity concentration of the first impurity portion ranges from $5 \times 10^{18}$ to $1 \times 10^{20}$ atoms/cm$^3$, and the thickness of the thin insulating film ranges from 100 Å to 1000 Å. Therefore, when the ionizing radiations are irradiated, the parastic channeling between the first and second circuit elements can be cut off by the first impurity portion, at the central section of the isolation region. On the other hand, the impurity concentration of the second and third impurity portions favorably ranges from $5 \times 10^{16}$ to $1 \times 10^{18}$ atoms/cm$^3$, and the thickness of the first and second thick insulating layers favorably ranges from 0.5 $\mu$m to 1.2 $\mu$m. These sections of the isolation region are useful for isolating the circuit elements when the ionizing radiations are not irradiated. Further, the thick and at least partly embedded insulating layer is employed to delineate active regions in which the circuit elements are to be formed, and the center section of the isolation region in which the first impurity portion is to be formed. When the circuit elements are N-channel type IGFET's and the N-type source and drain region of $5 \times 10^{19}$ atoms/cm$^3$ is abutted against the thick field insulating layer, the second or third impurity portion of P-type having the impurity concentration of $1 \times 10^{17}$ atoms/cm$^3$ forms a PN junction with the source or drain region. In this case, the breakdown voltage of the PN junction can maintain about 20 V, and problems do not occur. Whereas, if the first impurity portion of P-type having the impurity concentration of $1 \times 10^{19}$ atoms/cm$^3$ is directly contacted to the source and drain region, the breakdown voltage would become as low as 5 V or less. The area of the substrate may be a P-well. In this case, if another area of the substrate is of N-type conductivity type, many P-channel type IGFET's are formed therein to constitute a CMOS element with the N-channel IGFET in the P-well. In such a device, the first impurity portion of the present invention and P-type source and drain regions of the P-channel type IGFET's may be simultaneously formed by the same process.

DESCRIPTION OF THE PRIOR ART

Figure 1:
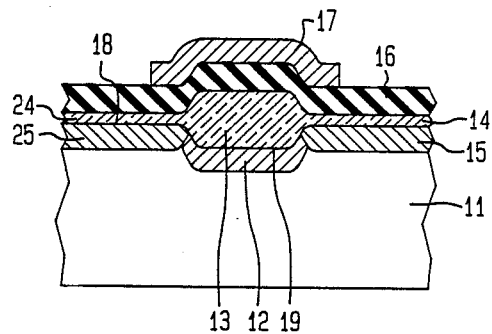
FIG. 1 is a cross-sectional view of an integrated circuit semiconductor device using a conventional isolation structure for isolating circuit elements.
Figure 2:
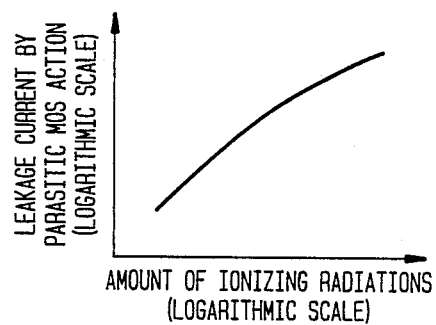
FIG. 2 is a diagram showing the leakage current by a parastic MOS action in a conventional isolation structure that varies depending upon the amount of the ionizing radiations.

Referring to FIG. 1, in a P-type silicon substrate 11 an N+-type source or drain region 15 of a first IGFET and an N+-type source or drain region 25 of a second IGFET are formed. The first and second IGFET's, that is, the N+-type region 15 and the N+-type region 25 are isolated by an isolation region consisting of a thick field silicon oxide layer 13 and a P+-type impurity region 12, that is, a channel stopper region 12. The thick field oxide layer 13 has the thickness of about 1.0 μm and embedded partly from the major surface 18 of the substrate 11 into the substrate, and the channel stopper region 12 is abutted against the bottom 19 of the thick field oxide layer 12. On the thick field oxide layer 13 and on the respective thin gate insulating films 14, 24 an intermediate insulating film 16 of phosphosilicate glass is formed, and a wiring layer 17 is provided on the isolation region. In such a construction, a parastic MOS transistor action is apt to occur. Namely, an inversion layer, in this case an N-type layer, is produced under the field layer 13 between the N+-type regions 15, 25 by applying a high voltage of positive polarity to the wiring layer 17, for example, when the thick field oxide layer 13 has the thickness of 1 μm, and the channel stopper region 12 has the impurity concentration of about $10^{17}$ atoms/cm$^3$. Further, in this structure, the intermediate insulating film 16 is interposed between the wiring layer 17 and the thick field oxide layer 13. It is estimated that the electric leakage current of a level of smaller than $10^{-20}$ A (ampere) flows between the N+-type regions 15, 25 belonging to the different IGFET's, respectively, when the distance between the N+-type regions 15, 25, that is, the length of the isolation region is 2 μm, and the width of each of the N+-type regions 15, 25 is about 50 μm. With respect to the potentials, a voltage of 5 volts is applied to the wiring layer 17 and the N+-type region 15, and the substrate 11 and the N+-type region 25 are maintained to a ground potential. Over an ordinary range of operating voltage, therefore, the leakage current by the parastic MOS transistor shown in FIG. 2 is negligible. If the device of the abovementioned structure is irradiated with ionizing radiations (γ-rays, α-rays or electron rays), however, positive holes in the electron-positive hole pairs formed in the oxide layer 13 migrate into the interface between the silicon substrate and the field oxide layer, and are trapped by the positive holes that are distributed in large amounts near the interface. Therefore, a fixed electrical charge of positive polarity accumulates in the field oxide layer 13. Accordingly, the leakage current by the parasitic MOS transistor action steadily increases with the increase in the amount of ionizing radiations as shown in FIG. 2. In the case of the parasitic MOS transistor action of the structure described above, for example, the leakage current increases by as much as about $10^{10}$ when the amount of ionizing radiations is $1 \times 10^5$ rad (Si). The increased leakage current adversely affects not only the characteristics of the active transistors alone but also the operational characteristics of the integrated circuit device. To cope with this problem, it can be attempted to increase the concentration of the impurity region 12 under the field oxide layer 13 so that little surface inversion takes place. However, the impurity concentration of the impurity region, that is, the channel stopper region is restricted to about $10^{18}$ atoms/cm$^3$ or less as mentioned above. Such a concentration is not sufficient to prevent the parasitic MOS transistor from leaking the current when it is irradiated with ionizing radiations.

DESCRIPTION OF THE EMBODIMENTS OF THE PRESENT INVENTION

Figure 3A:
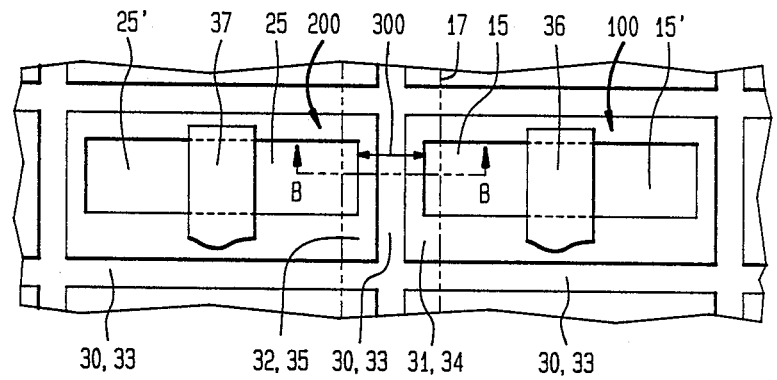
FIG. 3A is a plan view showing a first embodiment of the present invention.
Figure 3B:
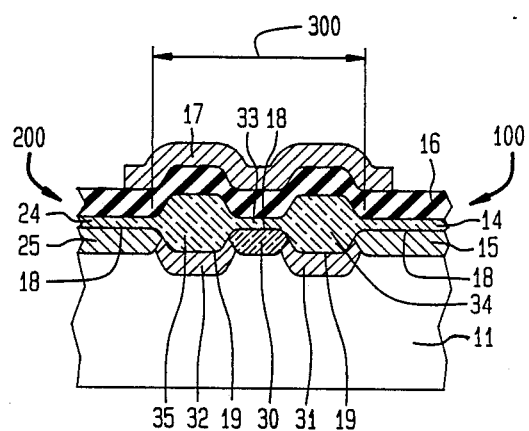
FIG. 3B is a cross-sectional view taken along line B—B' in FIG. 3A as viewed in the direction of arrows.

Referring to FIGS. 3A and 3B, the embodiment comprises a P$^-$-type silicon substrate 11 having an impurity concentration of $8 \times 10^{14}$ atoms/cm$^3$, a first N-channel type IGFET 100 and a second N-channel type IGFET 200. The first and second IGFET's are isolated and separated by an isolation region 300 of the present invention, and an wiring layer 17 of aluminum is provided on the isolation region 300 via an intermediate insulating film 16 of phosphosilicate glass. The intermediate insulating film on the isolation region is not necessary in some cases. To avoid complexity, the wiring layer 17 is shown by phantom lines in FIG. 3A. The first IGFET 100 comprises N+-type source and drain regions 15, 15' having the impurity concentration of $5 \times 10^{19}$ atoms/cm$^3$ and a gate electrode 36 of polycrystalline silicon provided on a channel region thereof via a gate insulating film 14. Also, the second IGFET 200 comprises N+-type source and drain regions 25, 25' having the impurity concentration of $5 \times 10^{19}$ atoms/cm$^3$ and a gate electrode 37 of polycrystalline silicon provided on a channel region thereof via a gate insulating film 24. The isolation region 300 isolates one of source and drain regions 15, 15' of the first IGFET 100 from one of source and drain regions 25, 25' of the second IGFET 200. The isolation region 300 comprises a first impurity portion 30 of P++-type having the impurity concentration of $1 \times 10^{19}$ atoms/cm$^3$, a thermally grown thin silicon oxide film 33 provided on the first impurity portion 30, a first thick field silicon oxide layer 34 provided between the first impurity portion 30 and the first IGFET 100 and partly embedded in the major surface 18 of the substrate, and a second thick field silicon oxide layer 35 provided between the first impurity portion 30 and the second IGFET 200 and partly embedded in the major surface 18 of the substrate. As shown in FIG. 3A, the isolation region with the first impurity portion 30 and the first or second insulating layer 34, 35 surrounds the respective IGFET's. The first and second thick field insulating layers 34, 35 having the thickness of 1.0 μm are provided between the surrounding first impurity portion and each of the IGFET's such that they delineate the position of the substrate in which the first impurity portion is to be formed and the positions of the substrate in which the IGFET's are to be formed. Further, in this embodiment, the isolation region 300 comprises second and third impurity portions 31, 32 of P+-type having the impurity concentration of $1 \times 10^{17}$ atoms/cm$^3$ provided under and abutted against the bottoms 19 of the first and second thick insulating layer 34, 35, respectively. According to the isolation structure 300, even when ionizing radiations such as αrays, γrays or electron rays are irradiated, the inversion layer can be effectively cut off at the center section consisting of the first impurity region 30 and the thin insulating film 33 of the isolation region 300. Further, the first impurity region 30 of high impurity concentration is not contacted to the source, drain regions 15, 25, and therefore, the high breakdown voltage can be expected. In FIGS. 3A and 3B, well-known electrodes and lead-out wiring layers for source and drain regions and gate electrodes are omitted for simplicity.

Figure 4A:
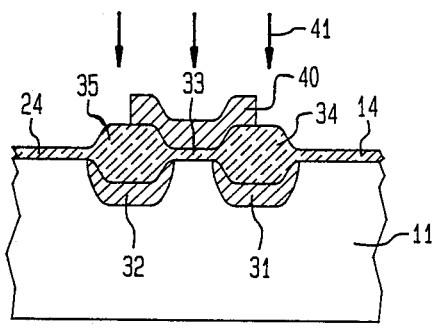
FIGS. 4A to 4C are cross-sectional views showing a manufacturing process in the order of steps according to the first embodiment of the present invention.
Figure 4B:
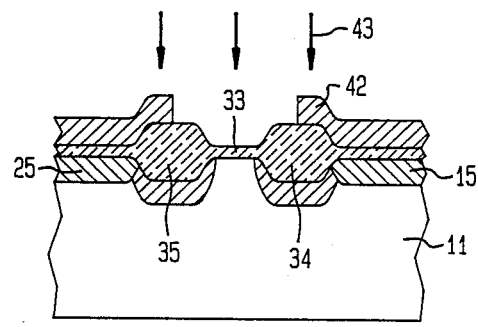
Figure 4C:
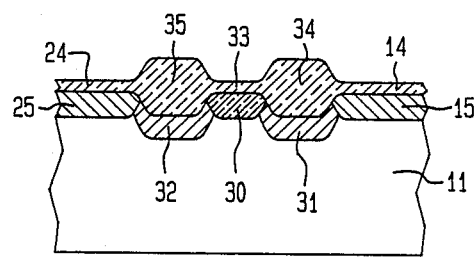

Referring to FIGS. 4A to 4C, the isolation region 300 of the first embodiment shown in FIG. 3B is formed by the following process steps. First, an antioxidation mask pattern (not shown) of, for example, silicon nitride is selectively formed on the major surface of the P−-type silicon substrate and a P-type impurity such as boron ion is introduced into the substrate through the ion-implantation method by using the silicon nitride pattern or a photo resist pattern (not shown) as a mask. Then, by subjecting a heat treatment at a high temperature for a long time, under an oxidizing atmosphere, such as oxygen or steam, the first and second thick field insulating layers 34, 35 are formed by using the silicon nitride pattern as a mask (see FIG. 4A). The thick field insulating layers 34, 35 are partly embedded from the major surface and thereunder the second and third impurity portions 31, 32 of P+-type are formed, respectively. After removing the silicon nitride pattern, gate insulating films 14, 15 and the thin silicon oxide film 33 are newly formed by a heat treatment. Then, the thermally grown thin film 33 of 800 Å thickness is covered by a first mask member 40 such as of aluminum, as shown in FIG. 4A, and an N-type impurity 41 such as phosphorus or arsenic ion is ion-implanted through the gate insulating films 14, 24 by using the first mask member 40, the field insulating layers 34, 35 and the silicon gate electrodes 36, 37 (FIG. 3A) as a mask to form source and drain regions 15, 15′, 25, 25′ of the first and second IGFET's. After removing the first mask member, a second mask member 42 of for example, aluminum, as shown in FIG. 4B, is selectively formed so as to expose the thin insulating film 33, and through the thin insulating film 33 a P-type impurity, such as, boron ion 43 is introduced into a substrate between the thick field insulating layers 34, 35 by an ion-implantation method. Then, after removing the second mask member 42, a heat treatment is conducted to activate the implanted boron ion, and the first impurity portion 30 of P++-type is formed (FIG. 4C).

According to this manufacturing process, the first impurity portion 30 of P++-type is not formed prior to effecting the field oxidation for forming the thick insulating layers 34, 35. Therefore, crystal defects do not develop when the field is oxidized, and the impurity concentration of the first impurity portion is not decreased by the thermal diffusion in oxidizing the field at a high temperature for an extended period of time.

Figure 5B:
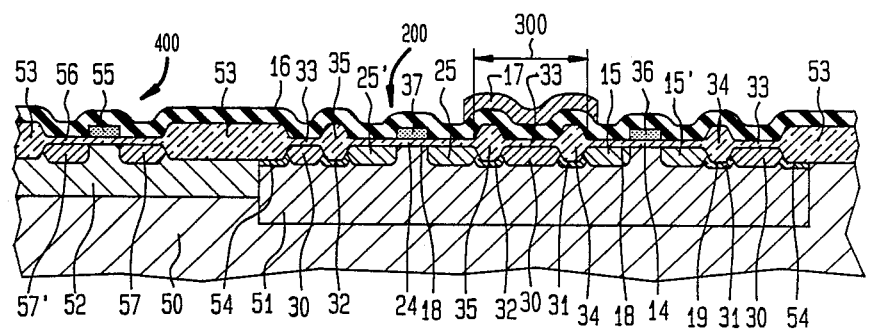
FIG. 5B is a cross-sectional view taken along line B—B' in FIG. 5A as viewed in the direction of arrows.
Figure 5A:
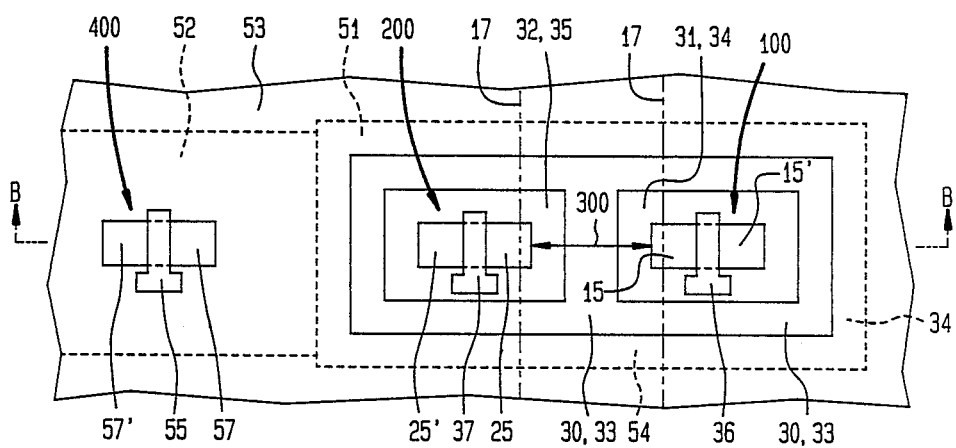
FIG. 5A is a plan view showing a second embodiment of the present invention.

Referring to FIGS. 5A and 5B, in an N−-type silicon substrate 50, an island-like P-type well 51 is formed, and N-channel type IGFET's 100, 200 are formed as in FIGS. 3A and 3B. Namely, in FIGS. 5A and 5B, components like those of the first embodiment shown in FIGS. 3A and 3B have been identified with like numerals. A P-type portion 54 and a thick field insulating layer 53 are simultaneously formed with the second and third impurity portions 31, 32 and the thick field insulating layers 34, 35 in the same process steps, respectively. In this second embodiment, an island-like N-type well 52 is provided, and a plurality of P-channel type IGFET's 400 are formed in the N-type well (in the drawings, only one IGFET is shown). The IGFET 400 comprises source and drain regions 57, 57′ of P++-type and a silicon gate electrode 55 formed on the channel region via a gate insulating film 56. With respect to the P-channel type IGFET's, the thick and partly embedded field oxide layer 53 is only provided to isolate respective P-channel type IGFET's. The source, drain regions 57, 57′ of the P-channel type IGFET 400 can be formed with the first impurity portion 30 of P++-type in the isolation reion 300. Therefore, if this embodiment is adapted to constitute a complementary MIS-type device, after forming the well in the substrate, any additional process step is not necessary other than the process steps in the first embodiment.

What is claimed is:

1. An integrated circuit semiconductor device comprising a semiconductor substrate, a first area of one conductivity type positioned in said substrate and having a first impurity concentration, a first circuit element having an impurity region of the opposite conductivity type formed in said first area of said substrate, a second circuit element having an impurity region of the opposite conductivity type formed in said first area of said substrate, and an isolation structure provided between the impurity regions of said first and second circuit elements, said isolation structure including a pair of thick insulating layers formed on the surface of said first area between said impurity regions of said first and second circuit elements, said pair of thick insulating layers being located with a gap therebetween, a thin insulating layer formed on a surface of said first area at said gap, said thin insulating layer being continuous with said pair of thick insulating layers, a first impurity portion of said one conductivity type having a second impurity concentration higher than said first impurity concentration and formed at the surface of said first area at a location directly under said thin insulating film, and a pair of second impurity portions of said one conductivity type having a third impurity concentration higher than said first impurity concentration and lower than said second impurity concentration, said pair of second impurity portions being formed at the surface of said first area at locations directly under said pair of thick insulating layers.

2. An integrated circuit semiconductor device of claim 1, in which said impurity concentration of said first impurity portion ranges from $5 \times 10^{18}$ to $1 \times 10^{20}$ atoms/cm$^3$.

3. An integrated circuit semiconductor device of claim 1, in which said impurity concentration of said first impurity portion ranges from $5 \times 10^{18}$ to $1 \times 10^{20}$ atoms/cm$^3$, and said impurity concentration of said pair of second impurity portions ranges from $5\times10^{16}$ to $1\times10^{18}$ atoms/cm$^3$, respectively.

4. An integrated circuit semiconductor device of claim 1 further comprising a second area of the opposite conductivity type positioned in said substrate, and a third circuit element having an impurity region of one conductivity type formed in said second area of said substrate.

5. An integrated circuit semiconductive device of claim 1, in which the conductivity type of said first area of said substrate is P-type, and said first and second circuit elements are N-channel type insulated gate field effect transistors, each of said impurity regions of said first and second circuit elements being source and drain regions of said transistors, respectively.

6. An integrated circuit semiconductor device of claim 4, in which the conductivity type of said first area of said substrate is P-type, and the conductivity of said second area of said substrate is N-type, said first and second circuit elements being N-channel type insulated gate field effect transistors, respectively, said third circuit element being a P-channel type insulated gate field effect transistor.

7. An integrated circuit semiconductor device of claim 1, in which said pair of thick insulating layers are at least partly embedded in said first area of said substrate.

8. An integrated circuit semiconductor device of claim 1, in which said first impurity portion is in contact with said pair of second impurity portions at its opposite sides.

9. An integrated circuit semiconductor device of claim 1, in which said pair of second impurity portions are in contact with said impurity regions of said opposite conductivity type of said first and second circuit elements, respectively.

10. An integrated circuit semiconductor device of claim 7, further comprising an elongated conductive layer formed on said pair of thick insulating layers and said thin insulating layer.

11. An integrated circuit semiconductor device of claim 7, further comprising another insulating layer covering said pair of thick insulating layers and said thin insulating layer.

12. An integrated circuit semiconductor device of claim 1, in which said pair of thick insulating layers are at least partly embedded in said first area of said substrate and said first impurity portion includes opposite sides thereof in contact with said pair of second impurity portions, said pair of second impurity portions being in contact with said impurity regions of said opposite conductivity type of said first and second circuit elements, respectively.

13. An integrated circuit semiconductor device of claim 12, further comprising an elongated conductive layer formed on said pair of thick insulating layers and said thin insulating layer.

* * * * *